(12) United States Patent
Kato et al.

(10) Patent No.: US 7,737,800 B2
(45) Date of Patent: Jun. 15, 2010

(54) FREQUENCY MODULATION CIRCUIT

(75) Inventors: Akira Kato, Osaka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 398 days.

(21) Appl. No.: 11/969,783

(22) Filed: Jan. 4, 2008

(65) Prior Publication Data
US 2008/0211596 A1    Sep. 4, 2008

(30) Foreign Application Priority Data
Jan. 9, 2007    (JP)    ............... 2007-001488

(51) Int. Cl.
H03C 3/06    (2006.01)
H03C 3/08    (2006.01)
H03L 7/08    (2006.01)
H04B 7/00    (2006.01)

(52) U.S. Cl. .................. 332/124; 332/127; 331/17; 331/23; 455/255; 455/260

(58) Field of Classification Search .............. 332/117, 332/123, 124, 126, 127; 327/156–159; 331/1 A, 331/8, 17, 18, 23, 25; 360/51; 375/376; 455/255, 257, 260
See application file for complete search history.

(56) References Cited

U.S. PATENT DOCUMENTS
2009/0289723 A1*    11/2009    Maeda et al. ............. 331/15

FOREIGN PATENT DOCUMENTS
JP    2-162407    6/1990

* cited by examiner

*Primary Examiner*—David Mis
(74) *Attorney, Agent, or Firm*—Wenderoth, Lind & Ponack, L.L.P.

(57) ABSTRACT

Provided is a frequency modulation circuit 1 for outputting a highly precise frequency-modulated signal regardless of variation in a characteristic of a VCO 15. A correction value calculation section 17 calculates a correction value $Vt_2$ based on a voltage value ($Vtx-Vt_1$) resulting from subtracting a control voltage $Vt_1$, which is generated by a control voltage generation section 11, from a control voltage Vtx at which a sensitivity of the VCO 15 is maximized. A variable amplifier 18 amplifies the correction value $Vt_2$. An addition section 13 outputs a control voltage $Vt_3$, which results from adding the amplified correction value $Vt_2$ to the control voltage $Vt_1$, to the VCO 15 via a DAC 14.

10 Claims, 10 Drawing Sheets

FREQUENCY MODULATION CIRCUIT

BACKGROUND OF THE INVENTION

1. Field of the Invention

The present invention relates to a frequency modulation circuit used for communication devices such as mobile phones and wireless LAN devices, and more particularly to a frequency modulation circuit which is capable of outputting a highly precise frequency-modulated signal regardless of variation in a characteristic of a VCO.

2. Description of the Background Art

Communication devices such as mobile phones and wireless LAN devices are required to secure precision of an output signal and operate with low power consumption. Such communication devices are required to have a frequency modulation circuit for outputting a highly precise frequency-modulated signal. Hereinafter, conventional frequency modulation circuits will be described.

There has been a conventional frequency modulation circuit which uses a PLL circuit, thereby correcting an output frequency of a VCO. However, such a frequency modulation circuit is not always capable of outputting a highly precise frequency-modulated signal due to variation in a characteristic of the VCO. FIG. 8 shows an example of variation in a VCO characteristic of the conventional frequency modulation circuit. In the conventional frequency modulation circuit, in order to obtain, e.g., a predetermined output frequency fo when VCOs respectively having different characteristics as shown in FIG. 8 are used, signals Va, Vb and Vc are required to be used as control signals for the VOCs.

There has been a conventional frequency modulation circuit for automatically correcting such variation in a VCO characteristic, e.g., frequency modulation circuit 50 disclosed in the Japanese Laid-Open Patent Publication No. 2-162407 (hereinafter, referred to as Patent Document 1). FIG. 9 is a block diagram showing an exemplary structure of the conventional frequency modulation circuit 50 disclosed in Patent Document 1. As shown in FIG. 9, a VCO 51 changes a frequency of an output signal D (i.e., frequency-modulated signal) in accordance with a control signal C. A phase comparing section 52 detects a phase difference between the output signal D from the VCO 51 and an input signal A, and outputs the detected phase difference as an error signal B. A correction circuit 53 detects a deviation, from a predetermined value, of the frequency of the output signal D of the VCO 51, and outputs the detected deviation as a correction signal E. An addition section 54 adds the error signal B to the correction signal E, and outputs a resultant signal as the control signal C.

FIG. 10 shows an exemplary characteristic of the VCO 51, which has been corrected by the conventional frequency modulation circuit 50. As shown in FIG. 10, the conventional frequency modulation circuit 50 is able to obtain the predetermined output frequency fo by using a single input signal A even if variation in the characteristic of the VCO 51 is caused by outputting, from the correction circuit 53 to addition section 54, of correction signals E which are Va, Vb and Vc, respectively. However, as shown in FIG. 10, the conventional frequency modulation circuit 50 does not correct a gradient of the characteristic of the VCO 51, and when the output frequency of the VCO 51 changes, the conventional frequency modulation circuit 50 is not always able to output a highly precise frequency-modulated signal.

Patent Document 1 discloses a conventional frequency modulation circuit 60 which is capable of correcting the gradient of the characteristic of the VCO 51. FIG. 11 is a block diagram showing an exemplary structure of the conventional frequency modulation circuit 60. The conventional frequency modulation circuit 60 in FIG. 11 is capable of correcting the gradient of the characteristic of the VCO 51 by outputting, from a multiplying section 55 to the addition section 54, a correction error signal H which is a result of multiplying the error signal B by the correction signal E.

However, the conventional frequency modulation circuit 60 corrects the variation in the characteristic of the VCO 51 under the assumption that the gradient of the characteristic of the VCO 51 is fixed. In reality, however, the gradient of the characteristic of the VCO 51 is not fixed. In other words, the VCO 51 does not have a linear sensitivity. FIG. 12 shows an exemplary input/output characteristic of the VCO 51 included in the conventional frequency modulation circuit 60. As shown in FIG. 12, the VCO 51 has a highest sensitivity when a control voltage Vt is at a predetermined voltage value Vtx, and the greater the deviation of the control voltage Vt from the predetermined voltage value Vtx, the lower is the sensitivity. Thus, even though the conventional frequency modulation circuit 60 is capable of correcting the gradient of the characteristic of the VCO 51, the frequency modulation circuit 60 is not capable of correcting the non-linearity of the sensitivity of the VCO 51.

SUMMARY OF THE INVENTION

Therefore, an object of the present invention is to provide a frequency modulation circuit which is capable of correcting the variation in the characteristic of the VCO as well as the non-linearity of the sensitivity of the VCO, and outputting a highly precise frequency-modulated signal.

The present invention is directed to a frequency modulation circuit having a VCO. In order to achieve the above object, the frequency modulation circuit of the present invention comprises: a control voltage generation section for generating a control voltage for controlling an output frequency of the VCO; a correction value calculation section for obtaining a correction value for correcting variation in a characteristic of the VCO; a variable amplifier for amplifying the correction value; and an addition section for adding the correction value to the control voltage generated by the control voltage generation section, and then outputting the control voltage to the VCO. The correction value calculation section obtains the correction value based on a voltage value resulting from subtracting the control voltage, which is generated by the control voltage generation section, from a control voltage at which a sensitivity of the VCO is maximized.

When the control voltage generated by the control voltage generation section is within a predetermined range, the correction value calculation section obtains the correction value for correcting non-linearity of the sensitivity of the VCO, based on the voltage value resulting from subtracting the control voltage, which is generated by the control voltage generation section, from the control voltage at which the sensitivity of the VCO is maximized.

In order to correct the non-linearity of the sensitivity of the VCO, the correction value calculation section calculates the correction value which allows a degree of the non-linearity of the sensitivity of the VCO to be near 1, and when the control voltage generated by the control voltage generation section is within the predetermined range, the degree of the non-linearity of the sensitivity of the VCO is obtained by the following equation using a maximum sensitivity Kmax and a minimum sensitivity Kmin of the VCO:

degree of the non-linearity of the sensitivity of the
$VCO = K\mathrm{max}/\{(K\mathrm{max}+K\mathrm{min})/2\}$ Preferably, when the control voltage generated by the control voltage generation section is within the predetermined range, the correction value calculation section calculates the correction value by polynomial approximation using the voltage value resulting from subtracting the control voltage, which is generated by the control voltage generation section, from the control voltage at which the sensitivity of the VCO is maximized.

The frequency modulation circuit may further comprise a look-up table in which optimal correction values are preset. In this case, when the control voltage generated by the control voltage generation section is within the predetermined range, the correction value calculation section can obtain the correction value by reading, from the look-up table, a correction value corresponding to the voltage value resulting from subtracting the control voltage, which is generated by the control voltage generation section, from the control voltage at which the sensitivity of the VCO is maximized.

Preferably, the frequency modulation circuit further comprises: a determination section for determining whether or not the control voltage generated by the control voltage generation section is within the predetermined range; and a switch circuit for, when the control voltage is not within the predetermined range, amplifying the control voltage by zero gain and outputting the control voltage to the addition section. In this case, when the control voltage is within the predetermined range, the correction value calculation section obtains the correction value for correcting the variation in the characteristic of the VCO.

Preferably, the frequency modulation circuit further comprises a temperature sensor for measuring a temperature of the VCO. When the sensitivity of the VCO changes, the variable amplifier obtains, in accordance with the temperature of the VCO which is measured by the temperature sensor, a gain which allows the sensitivity of the VCO to be fixed, and amplifies the correction value by the obtained gain.

The frequency modulation circuit further comprises a look-up table in which optimal gains corresponding to respective temperatures of the VCO are preset. When the sensitivity of the VCO changes, the variable amplifier obtains the gain which allows the sensitivity of the VCO to be fixed, by reading from the look-up table a gain corresponding to the temperature of the VCO which is measured by the temperature sensor.

Alternatively, the frequency modulation circuit may further comprise, instead of the temperature sensor, a sensitivity measuring section for measuring a sensitivity of the VCO. When the sensitivity of the VCO changes, the variable amplifier obtains, in accordance with the sensitivity of the VCO which is measured by the sensitivity measuring section, a gain which allows the sensitivity of the VCO to be fixed, and amplifies the correction value by the obtained gain.

The frequency modulation circuit further comprises a look-up table in which optimal gains corresponding to respective sensitivities of the VCO are preset. When the sensitivity of the VCO changes, the variable amplifier obtains the gain which allows the sensitivity of the VCO to be fixed, by reading from the look-up table a gain corresponding to the sensitivity of the VCO which is measured by the sensitivity measuring section.

As described above, according to the present invention, the correction value calculation section obtains the correction value based on the voltage value which results from subtracting the control voltage, which is generated by the control voltage generation section, from the control voltage at which the sensitivity of the VCO is maximized. This allows the variation in the characteristic of the VCO as well as the non-linearity of the sensitivity of the VCO to be corrected, and also enables a highly precise frequency-modulated signal to be outputted.

Further, by amplifying, at the variable amplifier, the correction value by a gain corresponding to the temperature of the VCO, the non-linearity of the VCO caused by a change in temperature or the like of the VCO can be corrected. Moreover, by amplifying, at the variable amplifier, the correction value by a gain corresponding to the sensitivity of the VCO, the non-linearity of the VCO caused by a change in temperature, aged deterioration or the like of the VCO can be corrected.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
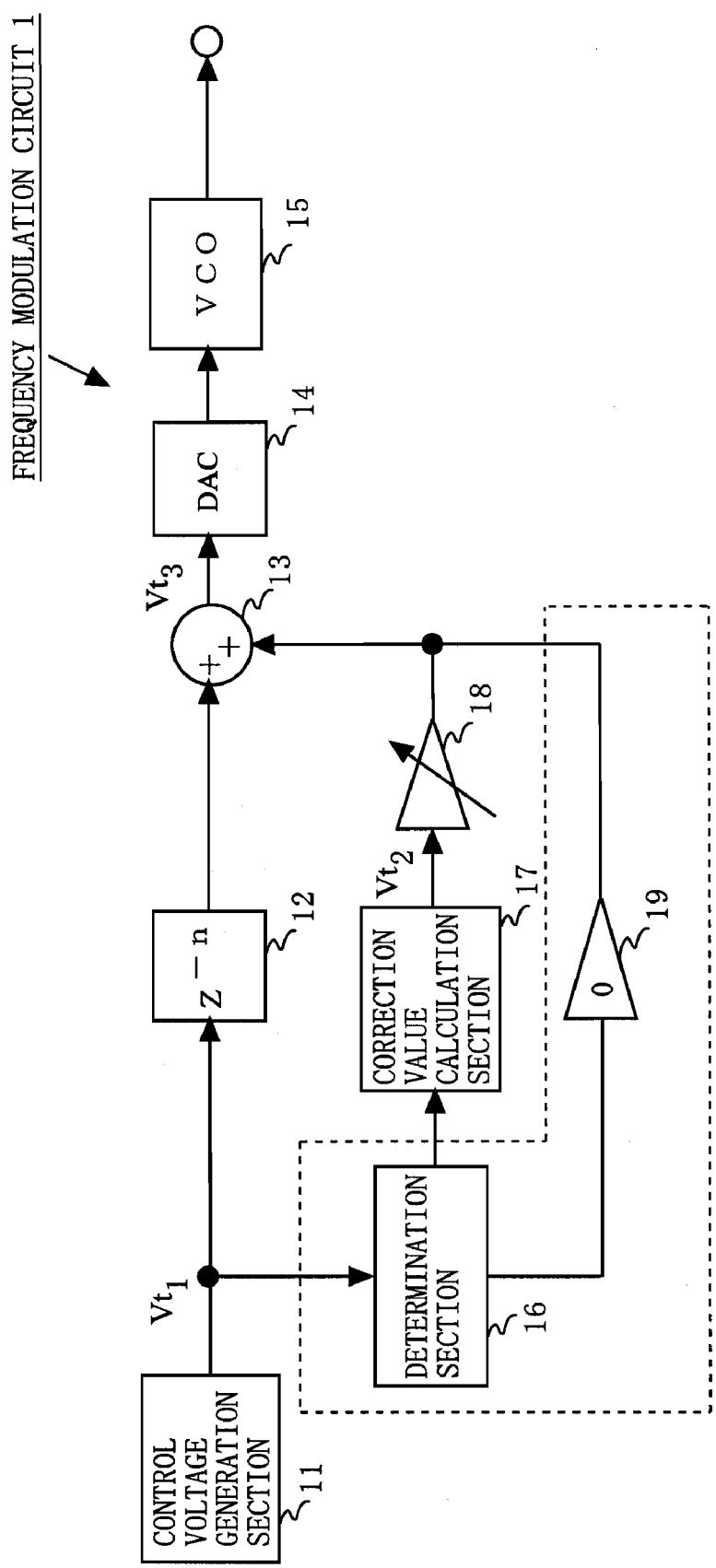
FIG. 1 is a block diagram showing an exemplary structure of a frequency modulation circuit 1 according to a first embodiment of the present invention.

FIG. 1 is a block diagram showing an exemplary structure of a frequency modulation circuit 1 according to a first embodiment of the present invention. As shown in FIG. 1, the frequency modulation circuit 1 comprises a control voltage generation section 11, timing adjusting section 12, addition section 13, DAC 14, VCO 15, determination section 16, correction value calculation section 17, variable amplifier 18 and a switch circuit 19.

The control voltage generation section 11 outputs a control voltage $Vt_1$ for controlling an output frequency of the VCO 15. The control voltage $Vt_1$ outputted from the control voltage generation section 11 is inputted to the VCO 15 via the timing adjusting section 12, addition section 13 and DAC 14, and controls the output frequency of the VCO 15. Also, the control voltage $Vt_1$ outputted from the control voltage generation section 11 is branched, and then inputted to the determination section 16. The determination section 16 determines whether or not the control voltage $Vt_1$ is within a predetermined range ($Vt1<Vt_1<Vth$). In other words, the determination section 16 determines whether or not the control voltage $Vt_1$ is within an expected range of use for the VCO 15.

When the determination section 16 determines that the control voltage $Vt_1$ is within the predetermined range, the determination section 16 outputs the control voltage $Vt_1$ to the correction value calculation section 17. When the control voltage $Vt_1$ is within the predetermined range, the correction value calculation section 17 calculates a correction value $Vt_2$ for correcting variation in a characteristic of the VCO 15. To be specific, the correction value calculation section 17 calculates, based on a voltage value ($Vtx-Vt_1$) resulting from subtracting the inputted control voltage $Vt_1$ from a control voltage Vtx at which a sensitivity of the VCO 15 is maximized, the correction value $Vt_2$ for correcting non-linearity of the sensitivity of the VCO 15. To be more specific, in order to correct the non-linearity of the sensitivity of the VCO 15, the correction value calculation section 17 calculates the correction value $Vt_2$ for planarizing the non-linearity of the sensitivity of the VCO 15 near a desired sensitivity (i.e., calculates the correction value $Vt_2$ for causing a degree of the non-linearity of the sensitivity of the VCO 15 to be near "1"). A range, within which the non-linearity of the sensitivity of the VCO 15 is to be planarized near the desired sensitivity, may be arbitrarily determined based on a system in accordance with an index of an EVM or the like. For example, the correction value calculation section 17 can arbitrarily determine, e.g., to planarize the non-linearity of the sensitivity of the VCO 15 within a range of ±5% from the desired sensitivity.

Described below is the degree of the non-linearity of the sensitivity of the VCO 15. The degree of the non-linearity of the sensitivity of the VCO 15 is desired to be "1". Defined here as the degree of the non-linearity of the sensitivity of the VCO 15 is a value which is obtained from normalizing, within the expected range of use (Vt1 to Vth) for the VCO 15, a maximum sensitivity of the VCO 15 by using an average sensitivity thereof. In other words, when it is assumed for the predetermined range (Vt1 to Vth) that the maximum sensitivity of the VCO 15 is Kmax and a minimum sensitivity is Kmin, the degree of the non-linearity of the sensitivity of the VCO 15 can be represented by the following equation (1):

$$\text{degree of the non-linearity of the VCO sensitivity} = K\max/\{(K\max+K\min)/2\} \quad \text{(equation 1)}$$

The correction value calculation section 17 can obtain the correction value $Vt_2$ based on an optimal calculation using the voltage value ($Vtx-Vt_1$) which is a result of subtracting the control voltage $Vt_1$ from the control voltage Vtx. For example, the correction value calculation section 17 may calculate the correction value $Vt_2$ by using an n-order polynomial equation such as the equation (2) below. In other words, the correction value $Vt_2$ can be calculated using polynomial approximation. Here, n is an arbitrary natural number, and an optimal value corresponding to the characteristic of the VCO 15 is inputted as $a_n$. The values n and an are calculated and set in advance at, e.g., factory setting.

$$Vt_2 = a_1(Vtx-Vt_1) + a_2(Vtx-Vt_1)^2 \ldots + a_n(Vtx-Vt_1)^n \quad \text{(equation 2)}$$

Figure 2A:
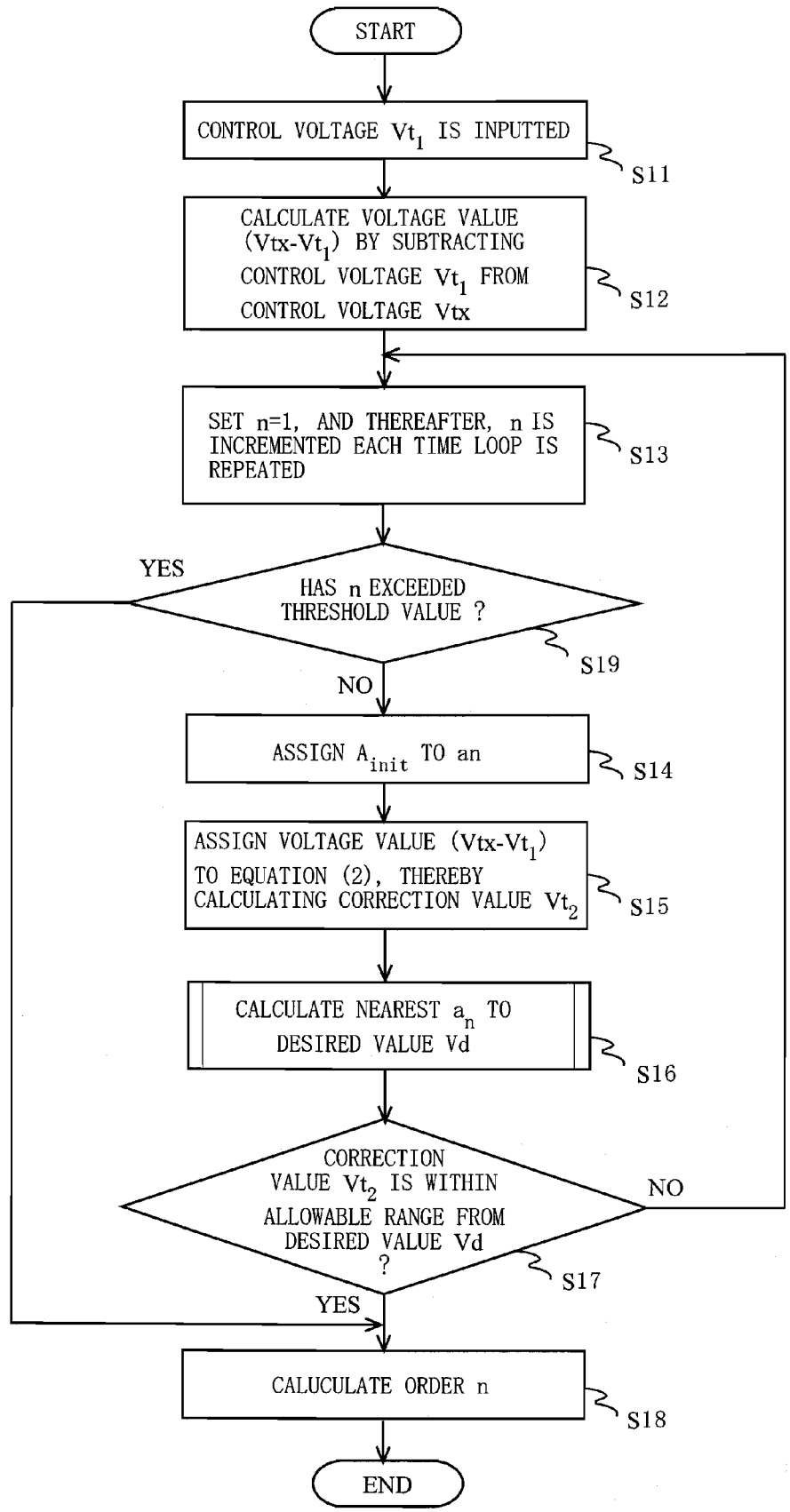
FIG. 2A is a flowchart showing an example of operations which are performed at factory setting or the like to calculate an order n and a value $a_n$ of a polynomial equation shown in an equation (2)

FIG. 2A is a flowchart showing an example of operations which are performed at factory setting or the like to calculate the order n and the value $a_n$ of the polynomial equation shown in the equation (2). As shown in FIG. 2A, when the determination section 16 determines that the control voltage $Vt_1$ is within the predetermined range (Vt1 to Vth), the control voltage $Vt_1$ is inputted to the correction value calculation section 17 (step S11). Then, the correction value calculation section 17 calculates the voltage value ($Vtx-Vt_1$) by subtracting the inputted control voltage $Vt_1$ from the control voltage Vtx at which the sensitivity of the VCO 15 is maximized (step S12). Next, the correction value calculation section 17 sets n to 1. Thereafter, each time a loop is repeated, n is incremented by 1 (step S13).

When n=1, the correction value calculation section 17 assigns an initial value $A_{init}$ to $a_n$ (step S14). The correction value calculation section 17 also assigns the calculated voltage value ($Vtx-Vt_1$) to the equation (2), thereby calculating the correction value $Vt_2$ (step S15). Next, the correction value calculation section 17 performs a process to calculate the value $a_n$ which allows a nearest correction value $Vt_2$ to the desired value Vd to be outputted (step S16). Step S16 will be described later in detail. The correction value calculation section 17 determines whether or not the calculated correction value $Vt_2$ is within an allowable range (e.g., ±5%) from a desired value Vd (step S17). Here, the desired value Vd is the correction value $Vt_2$ which is set such that when the control voltage $Vt_1$ is corrected using the desired value Vd, the linearity of the sensitivity of the VCO 15 becomes planarized. When the calculated correction value $Vt_2$ is within the allowable range from the desired value Vd, the correction value calculation section 17 outputs the value n at this point as the order n, and terminates processing (step S18). On the other hand, when the calculated correction value $Vt_2$ is not within the allowable range from the desired value Vd, the correction value calculation section 17 returns to step S13, and reiterates the above processes until the calculated correction value $Vt_2$ falls within the allowable range from the desired value Vd, or until n exceeds a threshold value (step S19)(the threshold value can be arbitrarily set).

Figure 2B:
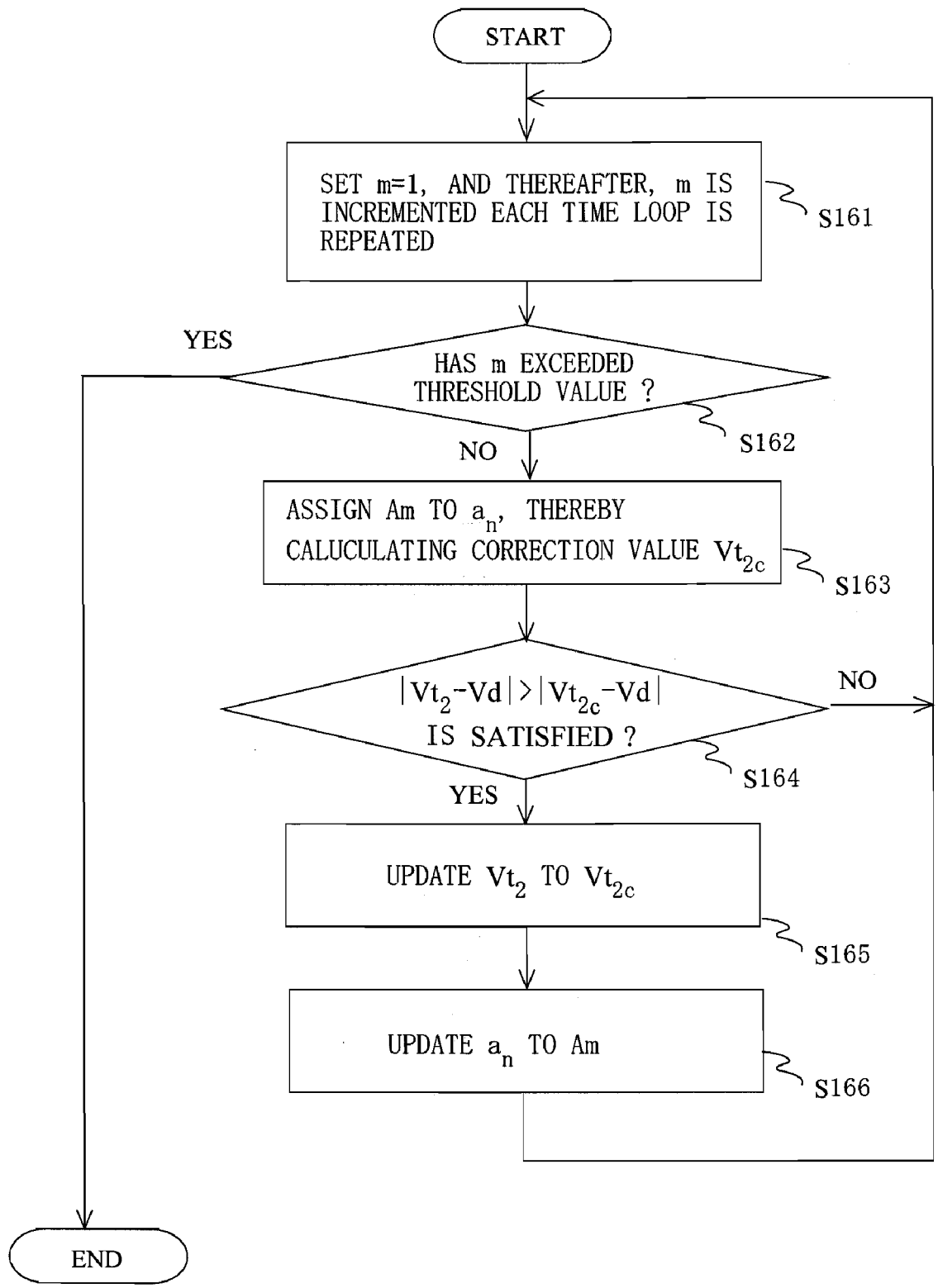
FIG. 2B is a flowchart showing in detail operations performed at step S16.

FIG. 2B is a flowchart showing in detail operations performed at step S16. As shown in FIG. 2B, the correction value calculation section 17 sets m to 1. Thereafter, each time a loop is repeated, m is incremented by 1 (step S161). When m=1, the correction value calculation section 17 assigns $A_m$ to $a_n$, thereby calculating a correction value $Vt_{2c}$ (step S163). Here, the correction value calculation section 17 determines whether or not the calculated correction value $Vt_{2c}$ satisfies a relationship shown in the following equation (3)(step S164):

$$|Vt_2-Vd|>|Vt_{2c}-Vd| \quad \text{(equation 3)}$$

When the relationship shown in the equation (3) is satisfied, the correction value calculation section 17 updates the correction value $Vt_2$ to the new correction value $Vt_{2c}$ (step S165). Also, the correction value calculation section 17 updates $a_n$ to $A_m$ (step S166). When the relationship shown in the equation (3) is not satisfied, the correction value calculation section 17 returns to the process at step S161, and reiterates the above processes until m exceeds the threshold value (threshold value cane be arbitrarily set) (step S162).

Note that, it is described above that in the processing shown in FIGS. 2A and 2B, the correction value calculation section 17 calculates, at factory setting or the like, the order n and the value $a_n$ of the above polynomial equation. However, by connecting the frequency modulation circuit 1 to a device for the factory setting or the like (not shown), such a device, instead of the correction value calculation section 17, may calculate the order n and the value $a_n$ of the above polynomial equation.

The correction value $Vt_2$ calculated by the correction value calculation section 17 is inputted to the variable amplifier 18. The variable amplifier 18 amplifies the correction value $Vt_2$ by using a predetermined gain, and outputs the amplified correction value $Vt_2$ to the addition section 13.

On the other hand, when the determination section 16 determines that the control voltage $Vt_1$ is not within the predetermined range, the determination section 16 outputs the control voltage $Vt_1$ to the switch circuit 19. The switch circuit 19 amplifies the control voltage $Vt_1$ by zero gain, and outputs the control voltage $Vt_1$ to the addition section 13. The addition section 13 outputs, to the VCO 15 via the DAC 14, a control voltage $Vt_3$ which results from adding the amplified correction value $Vt_2$ to the control voltage $Vt_1$. The VCO 15 outputs a signal whose frequency changes in accordance with the control voltage $Vt_3$ (i.e., frequency-modulated signal).

Figure 3:
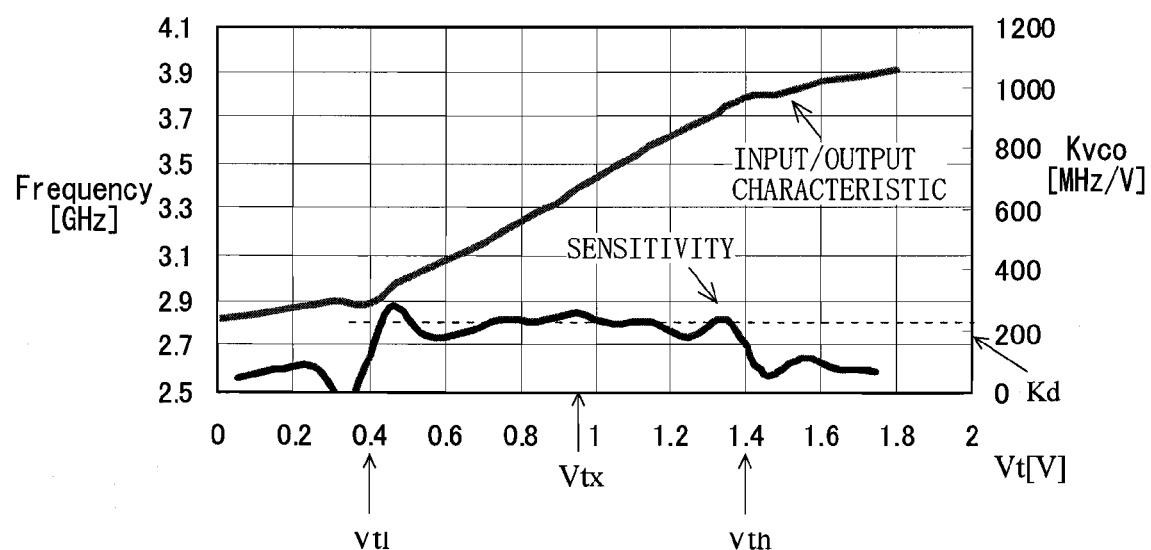
FIG. 3 shows an exemplary input/output characteristic of a VCO 15 included in the frequency modulation circuit 1 according to the first embodiment of the present invention.

FIG. 3 shows an exemplary input/output characteristic of the VCO 15 included in the frequency modulation circuit 1 according to the first embodiment of the present invention. As shown in FIG. 3, the sensitivity of the VCO 15 is almost flat within the predetermined range (Vtl to Vth), and planarized near the desired sensitivity. In other words, the non-linearity of the sensitivity of the VCO 15 is corrected within this range.

Note that, the determination section 16 and switch circuit 19 are not necessarily essential components for the frequency modulation circuit 1. In other words, the frequency modulation circuit 1 may have a structure which does not include the determination section 16 and switch circuit 19. In such a case, the control voltage $Vt_1$ outputted from the control voltage generation section 11 is branched, and directly inputted to the correction value calculation section 17. The correction value calculation section 17 calculates, based on the voltage value ($Vtx-Vt_1$) resulting from subtracting the directly inputted control voltage $Vt_1$ from the control voltage Vtx at which the sensitivity of the VCO 15 is maximized, the correction value $Vt_2$ for correcting the sensitivity of the VCO 15.

Further, the correction value calculation section 17 can obtain the correction value $Vt_2$ not only by the calculation based on the equation (2), but also by referring to a look-up table (LUT). In this case, the correction value calculation section 17 can obtain the correction value $Vt_2$ by reading, from the LUT, the correction value $Vt_2$ corresponding to the calculated voltage value ($Vtx-Vt_1$). Here, it is assumed that the LUT has an optimal correction value $Vt_2$ preset therein, the optimal correction value $Vt_2$ corresponding to the voltage value ($Vtx-Vt_1$) resulting from subtracting the control voltage $Vt_1$ from the control voltage Vtx at which the sensitivity of the VCO 15 is maximized.

Figure 4:
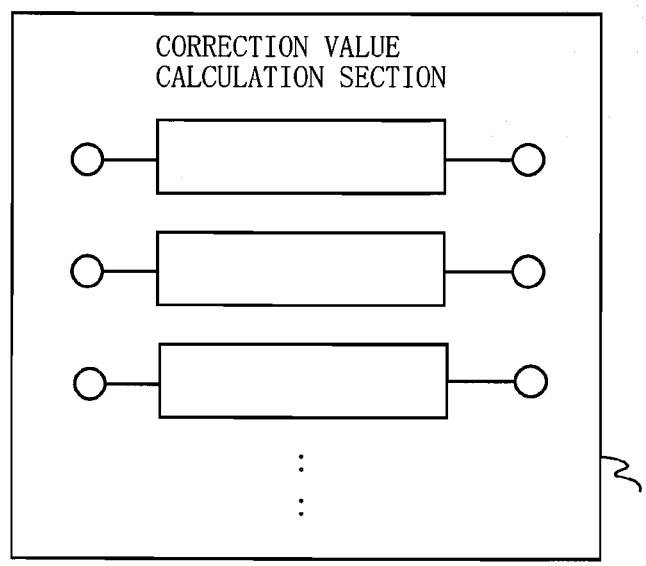
FIG. 4 is a block diagram showing an exemplary structure of the correction value calculation section 17.

Note that, the correction value calculation section 17 may obtain the optimal correction value $Vt_2$ not by referring to the LUT but by switching a circuit among a plurality of circuits, as shown in FIG. 4, in accordance with the voltage value ($Vtx-Vt_1$) resulting from subtracting the control voltage $Vt_1$ from the control voltage Vtx at which the sensitivity of the VCO 15 is maximized. It is assumed in this case that the correction value calculation section 17 has a plurality of circuits capable of outputting the optimal correction value $Vt_2$ in accordance with the voltage value ($Vtx-Vt_1$).

As described above, in the frequency modulation circuit 1 according to the first embodiment of the present invention, the correction value calculation section 17 obtains the correction value $Vt_2$ based on the voltage value ($Vtx-Vt_1$) resulting from subtracting the control voltage $Vt_1$, which is generated by the control voltage generation section 11, from the control voltage Vtx at which the sensitivity of the VCO 15 is maximized. This allows the variation in the characteristic of the VCO 15 as well as the non-linearity of the sensitivity of the VCO 15 to be corrected, and enables a highly precise frequency-modulated signal to be outputted.

Second Embodiment

Figure 5:
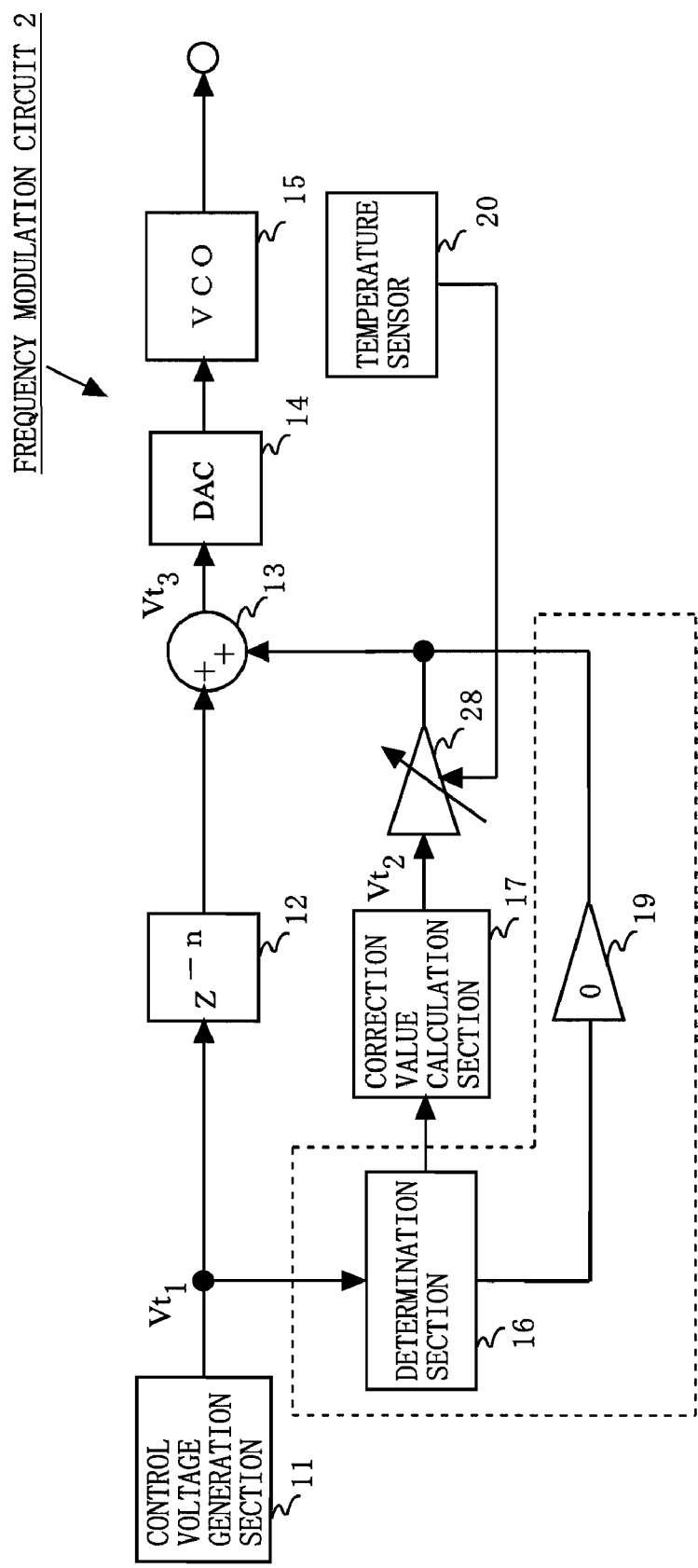
FIG. 5 is a block diagram showing an exemplary structure of a frequency modulation circuit 2 according to a second embodiment of the present invention.

FIG. 5 is a block diagram showing an exemplary structure of a frequency modulation circuit 2 according to a second embodiment of the present invention. As shown in FIG. 5, the frequency modulation circuit 2 is different from the frequency modulation circuit 1 of the first embodiment in that the frequency modulation circuit 2 further comprises a temperature sensor 20. The temperature sensor 20 measures a temperature of the VCO 15. Note that, the temperature sensor 20 does not necessarily directly measures the temperature of the VCO 15. The temperature sensor 20 may measure a temperature of a peripheral circuit of the VCO 15, or a temperature of a dummy circuit of the VCO 15, thereby inferring the temperature of the VCO 15. A variable amplifier 28 amplifies the correction value $Vt_2$ by a gain corresponding to the temperature of the VCO 15 measured by the temperature sensor 20.

Figure 6:
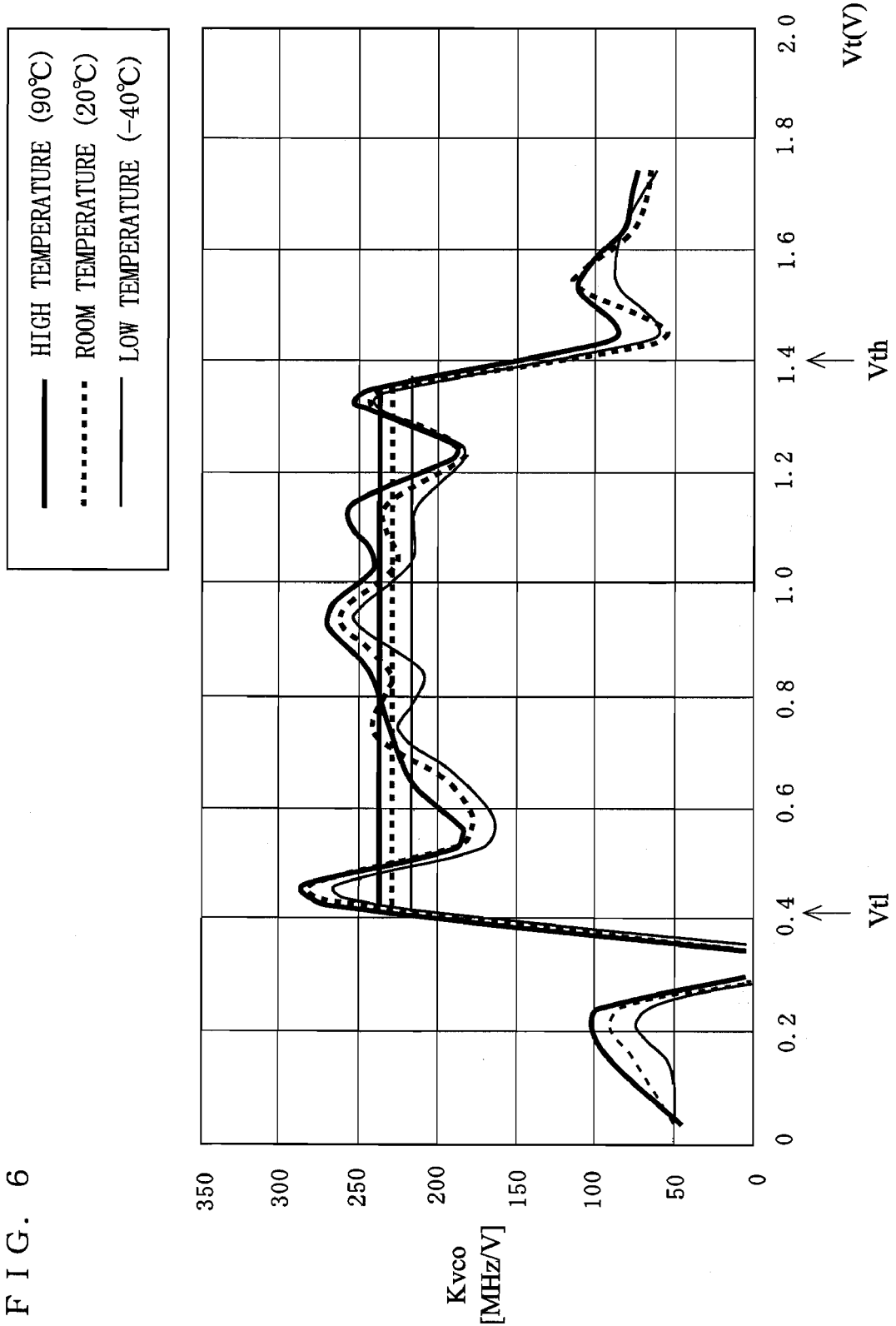
FIG. 6 shows an example of a sensitivity of the VCO 15, the sensitivity corresponding to a temperature thereof.

FIG. 6 shows an example of a sensitivity of the VCO 15, the sensitivity corresponding to the temperature of the VCO 15. As shown in FIG. 6, there is a possibility that the sensitivity of the VCO 15 changes in accordance with the temperature of the VCO 15. To be specific, in the case where the sensitivity of the VCO 15 changes due to a change in temperature of the VCO 15, the variable amplifier 28 obtains a gain, which allows the sensitivity of the VCO 15 to be fixed, and amplifies the correction value $Vt_2$ by the obtained gain. For example, in the case where the sensitivity of the VCO 15 increases to be higher than a desired sensitivity due to the temperature of the VCO 15 becoming high (e.g., 90° C.), the variable amplifier 28 decreases the gain for amplifying the correction value $Vt_2$, so as to lower the increased sensitivity. On the other hand, in the case where the sensitivity of the VCO 15 decreases to be lower than the desired sensitivity due to the temperature of the VCO 15 becoming low (e.g., −40° C.), the variable amplifier 28 increases the gain for amplifying the correction value $Vt_2$, so as to compensate for the decreased sensitivity.

Note that, the variable amplifier 28 may perform calculation to obtain, in accordance with the temperature of the VCO 15 measured by the temperature sensor 20, an optimal gain for amplifying the correction value $Vt_2$, or may refer to the look-up table (LUT) to obtain the optimal gain. In the case of referring to the LUT, the variable amplifier 28 reads, from the LUT, a gain corresponding to the temperature of the VCO 15 measured by the temperature sensor 20, thereby obtaining the optimal gain. Here, it is assumed that optimal gains corresponding to respective temperatures of the VCO 15 are preset in the LUT.

Alternatively, the correction value calculation section 17 may use, for obtaining the correction value $Vt_2$, the temperature of the VCO 15 measured by the temperature sensor 20. For example, the correction value calculation section 17 can obtain, for each temperature of the VCO 15, the correction value $Vt_2$ by reading, from the LUT, the correction value $Vt_2$ corresponding to the calculated voltage value ($Vtx-Vt_1$).

Here, it is assumed that for each temperature of the VCO 15, the LUT has an optimal correction value $Vt_2$ preset therein, the optimal correction value $Vt_2$ corresponding to the voltage value $(Vtx-Vt_1)$ resulting from subtracting the control voltage $Vt_1$ from the control voltage Vtx at which the sensitivity of the VCO 15 is maximized.

As described above, the frequency modulation circuit 2 according to the second embodiment of the present invention is, in addition to producing the effect of the first embodiment, capable of correcting the non-linearity of the sensitivity of the VCO 15 caused by a change in temperature of the VCO 15, by amplifying, at the variable amplifier 28, the correction value $Vt_2$ by a gain corresponding to the temperature of the VCO 15. Consequently, the frequency modulation circuit 2 is able to correct the variation in the characteristic of the VCO 15 as well as the non-linearity of the sensitivity of the VCO 15, and output a highly precise frequency-modulated signal.

Third Embodiment

Figure 7:
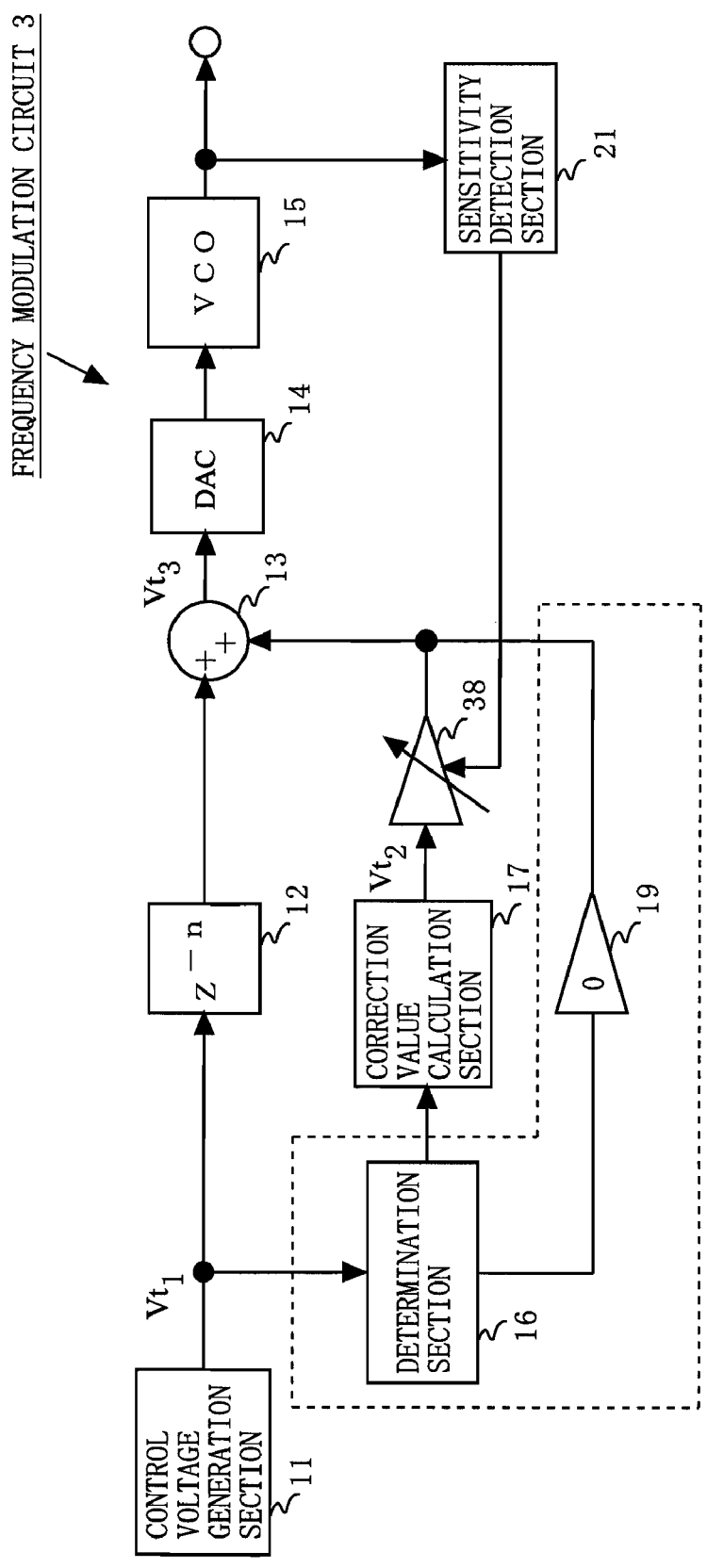
FIG. 7 is a block diagram showing an exemplary structure of a frequency modulation circuit 3 according to a third embodiment of the present invention.
Figure 8:
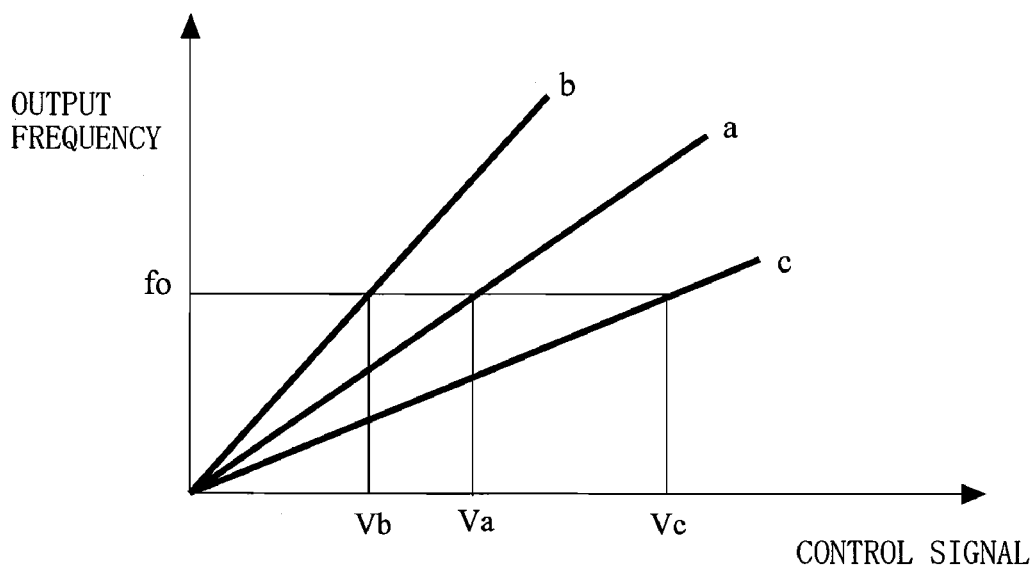
FIG. 8 shows an example of variation in a VCO characteristic of a conventional frequency modulation circuit.
Figure 9:
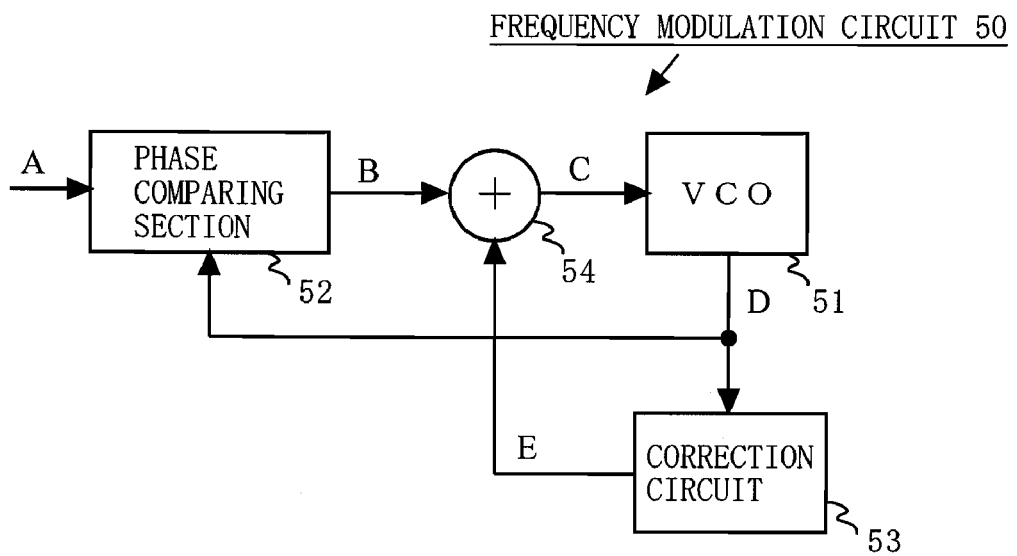
FIG. 9 is a block diagram showing an exemplary structure of a conventional frequency modulation circuit 50.
Figure 10:
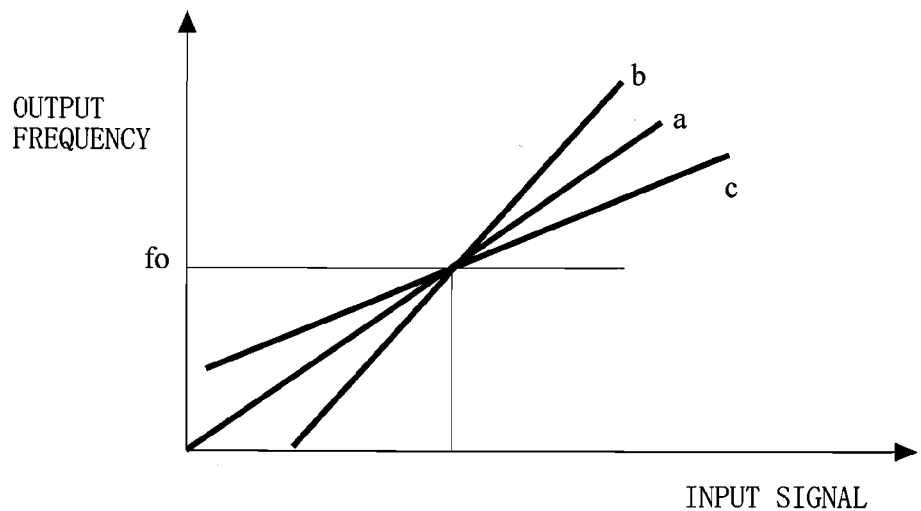
FIG. 10 shows an exemplary characteristic of a VCO 51, which has been corrected by the conventional frequency modulation circuit 50.
Figure 11:
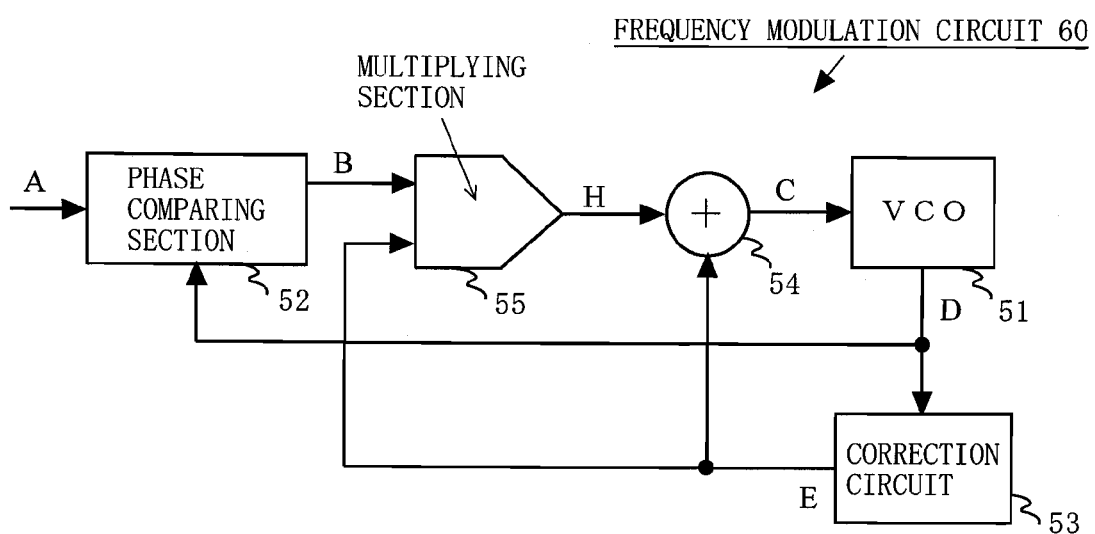
FIG. 11 is a block diagram showing an exemplary structure of a conventional frequency modulation circuit 60.
Figure 12:
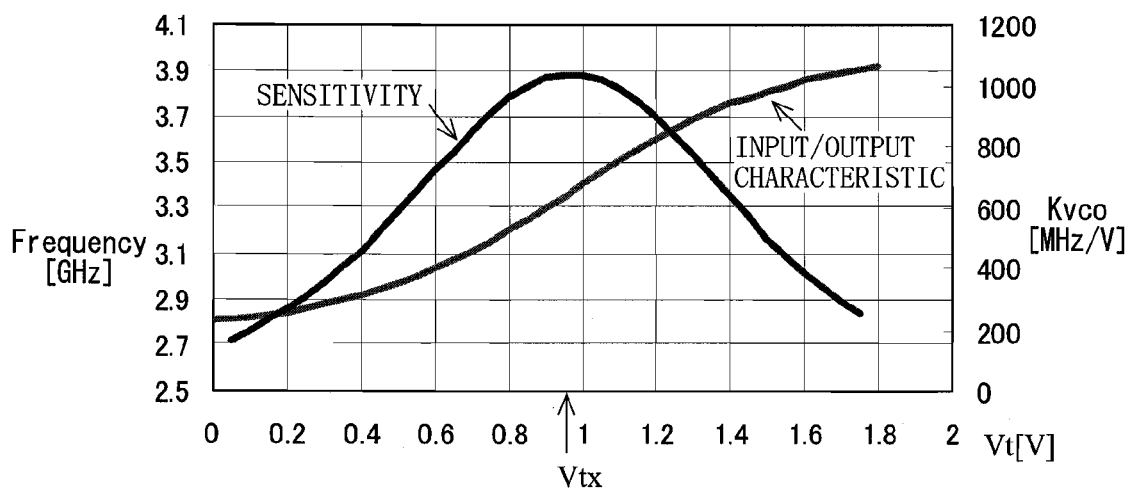
FIG. 12 shows an exemplary input/output characteristic of the VCO 51 included in the conventional frequency modulation circuit 60.

FIG. 7 is a block diagram showing an exemplary structure of a frequency modulation circuit 3 according to a third embodiment of the present invention. As shown in FIG. 7, the frequency modulation circuit 3 is different from the frequency modulation circuit 1 of the first embodiment in that the frequency modulation circuit 3 further comprises a sensitivity detection section 21. The sensitivity detection section 21 detects a sensitivity of the VCO 15, based on an output signal from the VCO 15. A variable amplifier 38 amplifies the correction value $Vt_2$ by a gain corresponding to the sensitivity of the VCO 15 detected by the sensitivity detection section 21. To be specific, in the case where the sensitivity of the VCO 15 changes due to, e.g., a change in temperature of the VCO 15, the variable amplifier 38 calculates a gain which allows the sensitivity of the VCO 15 to be fixed, and amplifies the correction value $Vt_2$ by the gain. For example, in the case where the sensitivity of the VCO 15 increases to be higher than a desired sensitivity, the variable amplifier 38 decreases the gain for amplifying the correction value $Vt_2$, so as to lower the increased sensitivity. On the other hand, in the case where the sensitivity of the VCO 15 decreases to be lower than the desired sensitivity, the variable amplifier 38 increases the gain for amplifying the correction value $Vt_2$, so as to compensate for the decreased sensitivity.

In other words, even in the case where, e.g., the sensitivity of the VCO 15 changes due to a change in temperature or the like of the VCO 15 as shown in FIG. 6, the variable amplifier 38 is able to, without measuring the temperature of the VCO 15, amplify the correction value $Vt_2$ by a gain which allows the sensitivity of the VCO 15 to be fixed. Further, since control can be performed without depending on the temperature of the VCO 15, the variable amplifier 38 is able to amplify the correction value $Vt_2$ by an optimal gain even if, for example, the sensitivity of the VCO 15 has changed due to aged deterioration or the like of the VCO 15. Still further, since there is no necessity to use a table to correct the sensitivity of the VCO, the amount of memory to be mounted can be reduced.

Note that, the variable amplifier 38 may obtain, in accordance with the sensitivity of the VCO 15, the optimal gain for amplifying the correction value $Vt_2$, not only by calculation but also by referring to a look-up table (LUT). In the case of referring to the LUT, the variable amplifier 38 is able to obtain the optimal gain by reading, from the LUT, a gain corresponding to the sensitivity of the VCO 15 measured by the sensitivity detection section 21. Here, it is assumed that optimal gains corresponding to respective sensitivities of the VCO 15 are preset in the LUT.

Still further, the correction value calculation section 17 may use, for obtaining the correction value $Vt_2$, the sensitivity of the VCO 15 detected by the sensitivity detection section 21. For example, the correction value calculation section 17 is able to, for each sensitivity of the VCO 15, obtain the correction value $Vt_2$ by reading, from the LUT, the correction value $Vt_2$ corresponding to the calculated voltage value $(Vtx-Vt_1)$. Here, it is assumed that for each sensitivity of the VCO 15, the LUT has an optimal correction value $Vt_2$ preset therein, the optimal correction value $Vt_2$ corresponding to the voltage value $(Vtx-Vt_1)$ resulting from subtracting the control voltage $Vt_1$ from the control voltage Vtx at which the sensitivity of the VCO 15 is maximized.

As described above, the frequency modulation circuit 3 according to the third embodiment of the present invention is, in addition to providing the effect of the first embodiment, capable of correcting the non-linearity of the sensitivity of the VCO 15 caused by, e.g., a change in temperature or aged deterioration of the VCO 15, by amplifying, at the variable amplifier 38, the correction value $Vt_2$ by a gain corresponding to the sensitivity of the VCO 15. Consequently, the frequency modulation circuit 3 is able to correct the variation in the characteristic of the VCO 15 as well as the non-linearity of the sensitivity of the VCO 15, and output a highly precise frequency-modulated signal.

The frequency modulation circuits according to the present invention can be used for a transmission circuit or the like to be included in communication devices, e.g., mobile phones, wireless LAN devices or the like.

While the invention has been described in detail, the foregoing description is in all aspects illustrative and not restrictive. It is understood that numerous other modifications and variations can be devised without departing from the scope of the invention.

What is claimed is:

1. A frequency modulation circuit having a VCO, comprising:
   a control voltage generation section for generating a control voltage for controlling an output frequency of the VCO;
   a correction value calculation section for obtaining a correction value for correcting variation in a characteristic of the VCO;
   a variable amplifier for amplifying the correction value; and
   an addition section for adding the correction value to the control voltage generated by the control voltage generation section, and then outputting the control voltage to the VCO, wherein
   the correction value calculation section obtains the correction value based on a voltage value resulting from subtracting the control voltage, which is generated by the control voltage generation section, from a control voltage at which a sensitivity of the VCO is maximized.

2. The frequency modulation circuit according to claim 1, wherein when the control voltage generated by the control voltage generation section is within a predetermined range, the correction value calculation section obtains the correction value for correcting non-linearity of the sensitivity of the VCO, based on the voltage value resulting from subtracting the control voltage, which is generated by the control voltage generation section, from the control voltage at which the sensitivity of the VCO is maximized.

3. The frequency modulation circuit according to claim 2, wherein
in order to correct the non-linearity of the sensitivity of the VCO, the correction value calculation section calculates the correction value which allows a degree of the non-linearity of the sensitivity of the VCO to be near 1, and
when the control voltage generated by the control voltage generation section is within the predetermined range, the degree of the non-linearity of the sensitivity of the VCO is obtained by the following equation using a maximum sensitivity Kmax and a minimum sensitivity Kmin of the VCO:

degree of the non-linearity of the sensitivity of the $VCO = K\text{max}/\{(K\text{max}+K\text{min})/2\}$.

4. The frequency modulation circuit according to claim 2, wherein when the control voltage generated by the control voltage generation section is within the predetermined range, the correction value calculation section calculates the correction value by polynomial approximation using the voltage value resulting from subtracting the control voltage, which is generated by the control voltage generation section, from the control voltage at which the sensitivity of the VCO is maximized.

5. The frequency modulation circuit according to claim 2, further comprising a look-up table in which optimal correction values are preset, wherein
when the control voltage generated by the control voltage generation section is within the predetermined range, the correction value calculation section obtains the correction value by reading, from the look-up table, a correction value corresponding to the voltage value resulting from subtracting the control voltage, which is generated by the control voltage generation section, from the control voltage at which the sensitivity of the VCO is maximized.

6. The frequency modulation circuit according to claim 1, further comprising:
a determination section for determining whether or not the control voltage generated by the control voltage generation section is within the predetermined range; and
a switch circuit for, when the control voltage is not within the predetermined range, amplifying the control voltage by zero gain and outputting the control voltage to the addition section, wherein
when the control voltage is within the predetermined range, the correction value calculation section obtains the correction value for correcting the variation in the characteristic of the VCO.

7. The frequency modulation circuit according to claim 1, further comprising a temperature sensor for measuring a temperature of the VCO, wherein
when the sensitivity of the VCO changes, the variable amplifier obtains, in accordance with the temperature of the VCO which is measured by the temperature sensor, a gain which allows the sensitivity of the VCO to be fixed, and amplifies the correction value by the obtained gain.

8. The frequency modulation circuit according to claim 7, further comprising a look-up table in which optimal gains corresponding to respective temperatures of the VCO are preset, wherein
when the sensitivity of the VCO changes, the variable amplifier obtains the gain which allows the sensitivity of the VCO to be fixed, by reading from the look-up table a gain corresponding to the temperature of the VCO which is measured by the temperature sensor.

9. The frequency modulation circuit according to claim 1, further comprising a sensitivity measuring section for measuring a sensitivity of the VCO, wherein
when the sensitivity of the VCO changes, the variable amplifier obtains, in accordance with the sensitivity of the VCO which is measured by the sensitivity measuring section, a gain which allows the sensitivity of the VCO to be fixed, and amplifies the correction value by the obtained gain.

10. The frequency modulation circuit according to claim 9, further comprising a look-up table in which optimal gains corresponding to respective sensitivities of the VCO are preset, wherein
when the sensitivity of the VCO changes, the variable amplifier obtains the gain which allows the sensitivity of the VCO to be fixed, by reading from the look-up table a gain corresponding to the sensitivity of the VCO which is measured by the sensitivity measuring section.

* * * * *